United States Patent [19]

Tung

[11] Patent Number: 5,043,733
[45] Date of Patent: Aug. 27, 1991

[54] SUBTRACTOR-AMPLIFIER CIRCUIT FOR CASCADED ANALOG-DIGITAL CONVERTER

[75] Inventor: Pham N. Tung, Paris, France

[73] Assignee: Thomson Composants Microondes, Puteaux, France

[21] Appl. No.: 457,501

[22] Filed: Dec. 27, 1989

[30] Foreign Application Priority Data

Dec. 30, 1988 [FR] France .............................. 88 17490

[51] Int. Cl.⁵ ............................................. H03M 1/12
[52] U.S. Cl. .................................... 341/156; 341/161
[58] Field of Search ................ 341/136, 156, 161, 162

[56] References Cited

U.S. PATENT DOCUMENTS

| | | | |
|---|---|---|---|
| 4,535,319 | 8/1985 | Penney | 341/156 |
| 4,639,715 | 1/1987 | Doluca | 341/156 |
| 4,763,107 | 8/1988 | Koen et al. | 341/156 |
| 4,849,759 | 7/1989 | Hughes | 341/156 |
| 4,875,048 | 10/1989 | Shimizu et al. | 341/156 |

FOREIGN PATENT DOCUMENTS 2189938 1/1974 France .

*Primary Examiner*—J. R. Scott
*Assistant Examiner*—Marc S. Hoff
*Attorney, Agent, or Firm*—Oblon, Spivak, McClelland, Maier & Neustadt

[57] ABSTRACT

In a cascaded analog-digital converter, a first ADC determines the most significant bits. To determine the least significant bits, in a second ADC, it is necessary to assess the difference between the input analog signal $V_E$ and its already digitized part, reconverted into analog form. The subtractor/amplifier receives, firstly, the input signal $V_E$ which is converted into a current $i_E$ and, secondly, the most significant bits on a digital-analog converter. This constitutes a source, capable of being modulated, which gives a current $i_c$. Two parallel-mounted transistors differentiate between the current $i_c$ of the source capable of being modulated and the current $i_E$ corresponding to the input signal $V_E$, and amplify it. The disclosure is applicable to cascaded ADCs.

5 Claims, 2 Drawing Sheets

SUBTRACTOR-AMPLIFIER CIRCUIT FOR CASCADED ANALOG-DIGITAL CONVERTER

BACKGROUND OF THE INVENTION

1. Field of the Invention

The present invention concerns a subtractor/amplifier circuit incorporated into a fractionated analog-digital converter. This circuit enables the conversion of an analog signal into a high-precision digital signal, with a large number of bits, despite the limitation imposed by the resolution of the analog-digital converter (ADC).

2. Description of the Prior Art

In all known converters, irrespectively of their principle, the "significance" of the input analog signal is assessed by comparison with signals of known "significance". The greater the precision desired, that is, the greater the number of output bits desired, the smaller is the (constant) interval between the significance values. There comes a limit for which the interval, which represents the sensitivity or resolution of the ADC, is below the threshold voltage of the transistors forming the measurement circuits.

To cross this limit, the fractionated ADCs, which are known, isolate that part of the analog signal which is below the threshold voltage, amplify it and deliver the least significant bits with a degree of precision that could not possibly have been achieved otherwise.

SUMMARY OF THE INVENTION

The invention concerns a circuit that enables the isolation of this lower fraction of the analog signal and its conversion into binary signals. According to the invention, an input analog signal is addressed in parallel to a first ADC and to a subtractor/amplifier circuit. This first ADC delivers all the most significant bits for which there is no problem of sensitivity of the transistors. However, simultaneously, these bits are addressed to the subtractor wherein, reconverted into analog signal form, they are compared with the input analog signal: the difference is a small signal that is amplified so as to enable its conversion into digital form by a second ADC which delivers the least significant bits.

The subtractor/amplifier consists of two transistors in parallel, the common drain of which is supplied by a source of current that can be modulated. The source of current that can be modulated consists, firstly, of the current corresponding to the input signal and, secondly, of the current corresponding to the output bits from the first ADC which are reconverted into analog form. These two currents are subtracted from the two parallel-mounted transistors, the second one of which has a gain greater than that of the former one, thus providing for the amplification. The output of the subtractor/amplifier is achieved by mean of an output voltage stabilizer. The output signal is addressed to a second ADC which delivers the least significant bits.

More precisely, the invention concerns a subtractor/amplifier circuit for an analog-digital converter (ADC) that converts an input analog signal into an N-bit digital signal and comprises two cascaded ADCs, the first one of which delivers the most significant bits $N_1$ while the second one delivers the least significant bits $N_2$ of the N-bit signal. The circuit comprising an input transistor and an amplifier transistor, mounted in parallel and supplied by a source of current, capable of being modulated, formed by:

- an active load which converts the input analog signal applied to the gate of the transistor into a current proportionate to $N = N_1 + N_2$,
- a digital-analog converter in parallel with the active load, which reconverts the least significant bits $N_1$, coming from the first ADC, into a current proportionate to $N_1$, the current that goes through the amplifier transistor being equal to the difference between the current capable of being modulated and the current that goes through the input transistor, is thus proportionate to $N_2$.

BRIEF DESCRIPTION OF THE DRAWINGS

The invention will be understood more clearly from the following detailed description of an exemplary embodiment, based on the appended figures, of which.

DESCRIPTION OF A PREFERRED EMBODIMENT

To make the description clearer and more precise, the invention will be explained with reference to an example of an eight-bit ADC, set up with TEGFET type linear transistors made of gallium arsenide, with a range of variation, due to manufacturing, of the order of 20 mV to 30 mV, thus making it practically impossible to directly set up ADCs with a resolution of 10 mV for example. However, these precise details in no way restrict the scope of the invention, they are given solely for purposes of clarity.

Let $V_E$ be an input analog signal. If $v_o$ is the sensitivity or resolution of a standard ADC, it can be taken that:

$$V_E = N v_o$$

A standard eight-bit ADC, which therefor has eight outputs $S_i$ numbered 0 to 7, can measure $V_E$ in 255 intervals with a value $v_o$ and give $V_E$ as a binary number at its output, representing the number N $$N = \rho_o^7 S_i \cdot 2^i$$

The first bit is marked 0 because $2^0 = 1$.

In taking the four most significant bits, we obtain a number:

$$\begin{aligned} N_1 &= \sum_4^7 S_j \cdot 2^j \\ &= S_7 \cdot 2^7 + S_6 2^6 + S_5 \cdot 2^5 + S_4 \cdot 2^4 \\ &= 16(S_7 \cdot 2^3 + S_6 \cdot 2^2 + S_5 \cdot 2 + S_4) \end{aligned}$$

The number $N_1$ is measured by a four-bit ADC with a resolution of $16 v_o$ that is 16 times greater than that of the eight-bit ADC.

Technologically, it is far easier to make a four-bit ADC with a resolution of $16 v_o$ than an eight-bit ADC with a resolution of $v_o$. However, the number $N_1$ has to be complemented by means of a subtractor circuit enabling the measurement of:

$$V_S = V_E - N_1 v_o$$

and has to be amplified by 16:

$$V'_S = 16 V_S$$

Since, by definition, $V_E = N v_o$ $$V_S = (N - N_1) v_o = \rho_o{}^3 S_k . 2^k . v_o$$

$$V'_S = 16 V_S = 16 v_o \Sigma_o{}^3 S_k . 2^k = 16 v_o N_2$$

The signal $V'_S$ can be measured by a second four-bit ADC with a sensitivity of $16 v_o$, the output of which represents the complement $N_2$ of the number $N$ to be determined:

$$N = N_1 + N_2$$

Thus, two identical ADCs, with four bits each and with a sensitivity of $16 v_o$ each give $N_1$ and $N_2$ more easily than a single ADC with eight bits and with a sensitivity of $v_o$.

In other words, to digitize an analog signal on eight bits with a resolution of 10 mV, it is not possible to make an eight-bit ADC with 10 mV sensitivity (because of the manufacturing variation range of 20 to 30 mV), but it is possible to make two four-bit ADCs with a sensitivity of 160 mV, which give the same result.

Figure 1:
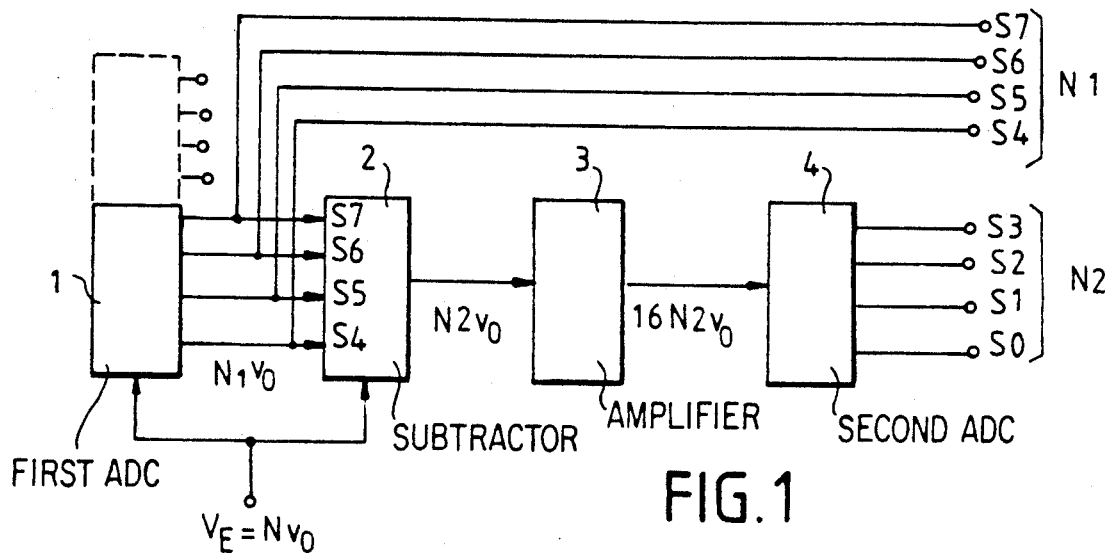
FIG. 1 shows a block diagram of a fractionated ADC using the subtractor/amplifier circuit according to the invention.

FIG. 1 shows a block diagram of a cascaded eight-bit ADC using the subtractor/amplifier circuit according to the invention.

The input signal $V_E = N v_o$ is addressed simultaneously to a first eight-bit ADC referenced 1, and to a subtractor 2. The extension in dashes of the first ADC pertains to the case where the digitization is done on twelve, sixteen or more bits: in this case, all the output signals of the ADC are addressed to the subtractor 2, to derive therefrom $N_2 = N - N_1$ The first ADC 1 delivers the four most significant bits $S_4$ to $S_7$ which are simultaneously addressed to the output of the overall device, and to the input of the subtractor 2. These four most significant bits measure the numbers $N_1$ from 16 to 240 in steps of 16 ($240 + 16 = 256$).

The set comprising the subtractor 2 and the amplifier 3 forms the subtractor/amplifier which is the object of the invention and shall be described in detail with reference to FIG. 2.

The analog signal that emerges therefrom, $16 N_2 v_o$ or, more generally, $K N_2 v_o$, is addressed to a second ADC 4, which is identical to the first ADC 1 and delivers the four least significant bits $S_0$ to $S_3$, which measure the numbers 0 to 15.

In the example chosen, the first ADC 1 has a resolution of $16 v_o$: the signals with a value of less than $16 v_o$ are detected by the subtractor 2 which compares the input signal $V_E = N v_o$ with the signal $N_1 v_o$ obtained by the reconversion of four bits $S_4$ to $S_7$ into an analog signal. The difference:

$$N v_o - N_1 v_o = N_2 v_o$$

is amplified by a factor 16 by the amplifier 3. The amplified signal $16 N_2 v_o$ is converted by the second ADC 4, which has the same resolution $16 v_o$ as the first ADC, into a four-bit binary number $N_2$.

Figure 2:
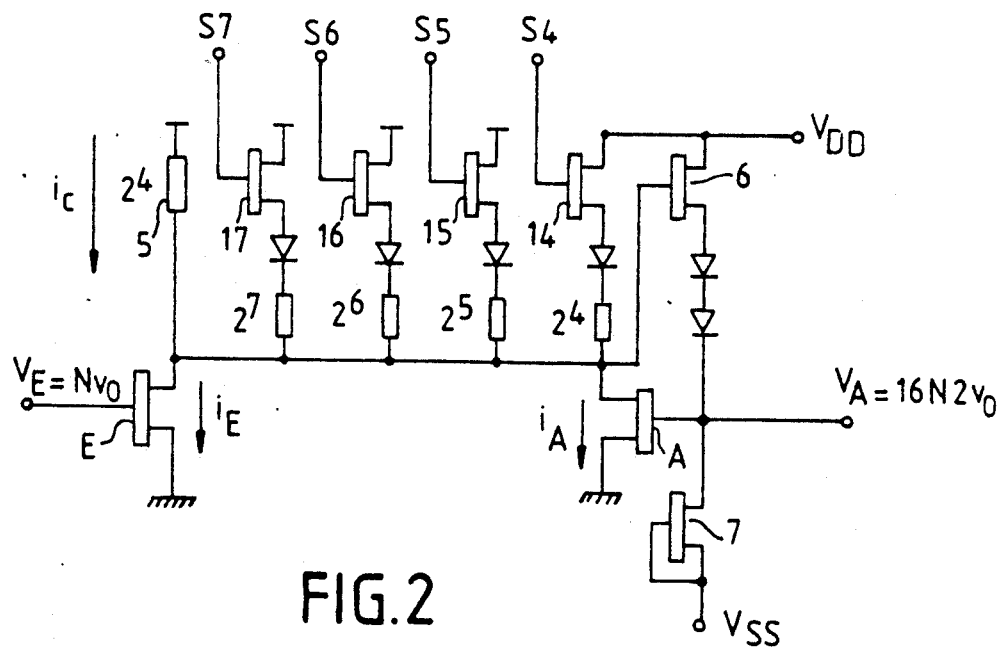
FIG. 2 shows the electrical diagram of the subtractor/amplifier according to the invention.

FIG. 2 shows the electrical diagram of the subtractor/amplifier circuit $2 + 3$.

It has a digital/analog converter formed by the four transistors 14 to 17 and their loads. The four most significant bits (logic 1 or 0) $S_4$ to $S_7$ (number $N_1$) are applied to the gates of the switch transistors 14 to 17, the sources of which are loaded, through a Schottky diode, by an active load, respectively with values $2^4$, $2^5$, $2^6$ and $2^7$. This digital/analog converter (DAC) thus gives a current $N_1 i_o$ ($i_o$ being the current corresponding to the voltage interval $v_o$).

It further has a voltage/current transformer, formed by the input transistor E and an active load 5, with a value $2^4 = 16$. The input signal $V_E = N v_o$, applied to the gate of the input transistor E, is transformed into a current $i_E = N i_o$.

Finally, at the output, an amplifier transistor A is joined to a system of stabilization of the output voltage $V_A$, consisting of a follower transistor 6 and its supply voltage 7.

Of course, all these transistors are supplied between a voltage $V_{DD}$ and the ground, or between $V_{DD}$ and $V_{SS}$ for the stabilization circuit.

From a technological point of view, the transistors E and A are linear, of the TEGFET type, with the same negative threshold voltages $V_T$. They have a slope or transconductance G which is constant but such that:

$$G_E = 16 G_A$$

The transistors 6 and 7 of the stabilization circuit have negative threshold voltages and the switch transistors 14 to 17 have positive threshold voltages. The active loads are transistors with their gate connected to the source. It is their dimensions that make these active loads put through currents in a proportion of: $2^4 i_o$, $2^5 i_o$, $2^6 i_o$ and $2^7 i_o$.

The load current $i$ is common to both transistors E and A.

$$i_c = i_E + i_A$$
$$i_c = 16 i_o + N_1 i_o$$
$$i_E = N i_o = (N_1 + N_2) i_o = G_E (V_E - V_T)$$
$$i_A = i_c - i_E = (16 - N_2) i_o = G_A (V_A - V_T)$$

(the threshold voltage $V_T$ is the same for both transistors E and A).

If the variation $\Delta V_E$ of the input signal does not exceed $16 v_o$, the ADC 1 does not load and $i_c$ is constant.

$$G_E \Delta V_E + G_A \Delta V_A = 0$$

$$\Delta V_A = - \frac{G_E}{G_A} \Delta V_E$$

But $G_E / G_A$ was chosen to be equal to 16. From the expression of $i_A$, we deduce:

$$V_A = (16 - N_2) 16 v_o + V_T$$

It is therefore possible to digitize $V_A$ by means of an ADC 4 with four bits and a sensitivity of $16 v_o$, the outputs of which give a binary number $$M = 16 - N_2$$

The number M is converted into a number $N_2$, either inverters or by using a cascaded ADC according to the French patent filed under the number 87 15535, dated 10th November 1987, belonging to the present Applicant, by using the complementary outouts $S_o$ to $S_3$ of this ADC

| $M = 16 - N2$ | $S_3$ | $S_2$ | $S_1$ | $S_0$ | $S_3$ | $S_2$ | $S_1$ | $S_0$ | $N_2$ |
|---|---|---|---|---|---|---|---|---|---|
| 16 | 1 | 1 | 1 | 1 | 0 | 0 | 0 | 0 | 0 |
| 15 | 1 | 1 | 1 | 0 | 0 | 0 | 0 | 1 | 1 |
| 14 | 1 | 1 | 0 | 1 | 0 | 0 | 1 | 0 | 2 |
| 13 | 1 | 1 | 0 | 0 | 0 | 0 | 1 | 1 | 3 |
| 12 | 1 | 0 | 1 | 1 | 0 | 1 | 0 | 0 | 4 |
| 11 | 1 | 0 | 1 | 0 | 0 | 1 | 0 | 1 | 5 |
| 10 | 1 | 0 | 0 | 1 | 0 | 1 | 1 | 0 | 6 |
| 9 | 1 | 0 | 0 | 0 | 0 | 1 | 1 | 1 | 7 |
| 8 | 0 | 1 | 1 | 1 | 1 | 0 | 0 | 0 | 8 |
| 7 | 0 | 1 | 1 | 0 | 1 | 0 | 0 | 1 | 9 |
| 6 | 0 | 1 | 0 | 1 | 1 | 0 | 1 | 0 | 10 |
| 5 | 0 | 1 | 0 | 0 | 1 | 0 | 1 | 1 | 11 |
| 4 | 0 | 0 | 1 | 1 | 1 | 1 | 0 | 0 | 12 |
| 3 | 0 | 0 | 1 | 0 | 1 | 1 | 0 | 1 | 13 |
| 2 | 0 | 0 | 0 | 1 | 1 | 1 | 1 | 0 | 14 |
| 1 | 0 | 0 | 0 | 0 | 1 | 1 | 1 | 1 | 15 |

The high stability output stage, formed by the transistors A, 6, 7 and the diodes, is described in the French patent filed under number 87 15866 dated 17th December 1987, belonging to the Applicant.

Thus, the eight-bit ADC of FIG. 1 makes it possible, through the subtractor/amplifier of the invention, to achieve a precise and easy digitization of an analog signal, the most significant bits of which are given by a first ADC and the least significant bits of which are given by a second ADC, both ADCs having the same sensitivity, in this case 16 $v_o$.

Figure 3:
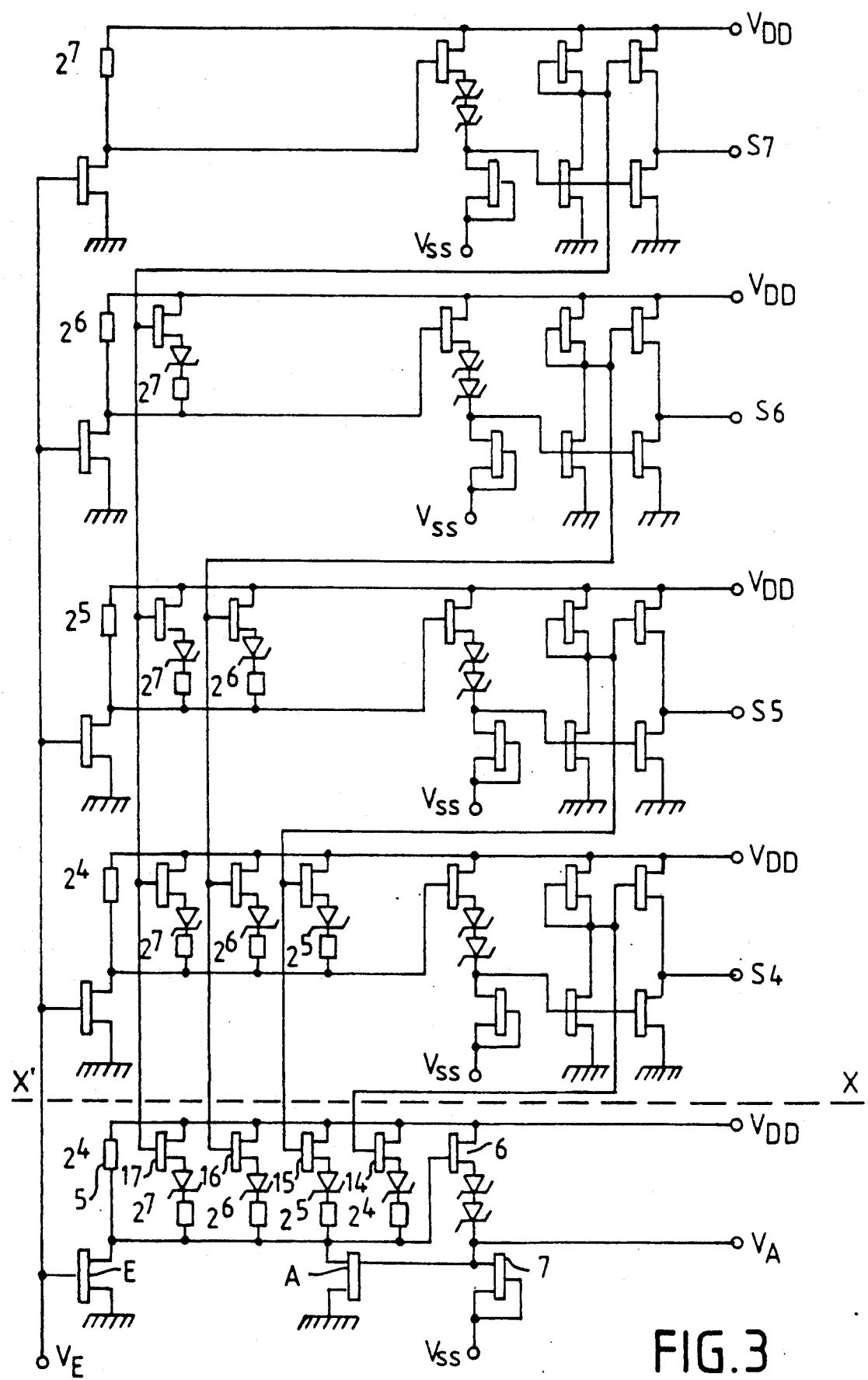
FIG. 3 shows the electrical diagram of the first ADC and of the subtractor/amplifier according to the invention.

FIG. 3 shows the electrical diagram of the first ADC and of the subtractor/amplifier according to the invention. It is cut through by a line of dashes X'X; above X'X there is a cascaded ADC according to the above-mentioned patent 87 15535 which delivers the most significant bits $S_4$ to $S_7$. Beneath X'X, there is the subtractor/amplifier according to the invention. The input signal $V_E$ is applied to it in parallel with the ADC 1, and it delivers a signal $V_A$ which, in turn, is applied to a second ADC 4 identical to the former one.

To make the explanation easier, it has been assumed that the ADC has eight bits, the four least significant bits of which are more easily determined by means of the invention (hence the number 16, because $2^4 = 16$). However, the transposition is clear to those skilled in the art, depending on:
 the number of bits required to determine N;
 the sensitivity $v_o$ required for each ADC 1 and 4;
 the technology used, and hence the variations in the making of the transistors.

In particular, if the number N is determined by i bits, in counting the bits from zero onwards, wherein the order j bit is the first of the most significant bits, the gain of the input transistor E is equal to $2^j$ times the gain of the amplifier transistor A, and the active loads are in a progression of $2^j, 2^{j+1} \ldots 2$ for the digital-analog converter.

The circuit according to the invention may be made of silicon but to obtain transistors E and A with well-defined slopes, it is preferable to make it out of gallium arsenide, with TEGFETS.

What is claimed is:

1. An analog-digital converter (ADC) which converts an input analog signal $V_E$ into a N-bit digital signal comprising:
    two cascaded ADCs, wherein a first ADC delivers at its output $N_1$ most significant bits of said N bit digital signal while a second ADC delivers at its output $N_2$ least significant bits of the N-bit signal, where N is an integer and $N_1 + N_2 = N$;
    a subtractor-amplifier circuit located between said first and second ADCs, said subtractor-amplifier circuit comprising:
    an input transistor and an amplifier transistor, mounted in parallel and supplied by a source of current $i_c$, capable of being modulated;
    an active load which converts the input analog signal $V_E$ applied to a gate of the input transistor into a current proportionate to N;
    a digital-analog converter in parallel with the active load which reconverts the most significant bits $N_1$, coming from the first ADC, into a current proportionate to $N_1$, wherein a current $i_A$ that goes through the amplifier transistor is equal to the difference between the current capable of being modulated and the current that goes through the input transistor and hence is proportionate to $N_2$.

2. A subtractor/amplifier circuit according to claim 1, wherein the input transistor and the amplifier transistor are two linear transistors having the same negative threshold voltage $V_T$, a slope or transconductance G of the input transistor being equal to $2^j$ times the slope of the amplifier transistor, j being the first of the most significant bits in counting the bits from zero onwards.

3. A subtractor/amplifier circuit according to claim 2, wherein the resistance of the active load that converts the input analog signal $V_E$ into a current $i_E$ is proportionate to 2.

4. A subtractor/amplifier circuit according to claim 2, wherein the digital-analog converter is formed by a plurality of transistors in parallel, respective gates of which are controlled by logic outputs of the first ADC, and the sources of which are each in series with a diode and with a load, the resistances of the plurality of the loads being proportionate to $2^j, 2^{j+1}, \ldots 2^i$ ohms, i being the total number of bits given by the cascaded ADC.

5. A subtractor/amplifier circuit according to claim 1, wherein the output voltage $V_A$ is stabilized by a stage comprising a follower transistor, a source of which is mounted in series with a plurality of shift diodes and with a supply voltage transistor, the output voltage being applied to a gate of the amplifier transistor.

* * * * *